US009119271B2

(12) United States Patent
Takei et al.

(10) Patent No.: US 9,119,271 B2
(45) Date of Patent: Aug. 25, 2015

(54) LIGHTING DEVICE TO PRODUCE PREFERABLE PRECEPTION OF SKIN COLOR

(71) Applicant: PANASONIC CORPORATION, Osaka (JP)

(72) Inventors: Naoko Takei, Osaka (JP); Kouji Nishioka, Osaka (JP); Sayaka Nishi, Osaka (JP); Takashi Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 266 days.

(21) Appl. No.: 13/952,791

(22) Filed: Jul. 29, 2013

(65) Prior Publication Data

US 2014/0042895 A1 Feb. 13, 2014

(30) Foreign Application Priority Data

Aug. 13, 2012 (JP) ................................ 2012-179390

(51) Int. Cl.
*F21V 9/16* (2006.01)
*H05B 33/12* (2006.01)
*H01L 33/50* (2010.01)

(52) U.S. Cl.
CPC .............. *H05B 33/12* (2013.01); *H01L 33/504* (2013.01)

(58) Field of Classification Search
CPC ................................ H01L 33/504; F21V 9/16
USPC .................................... 313/501–503; 362/84
See application file for complete search history.

(56) References Cited

U.S. PATENT DOCUMENTS 8,581,488 B2 * 11/2013 Sakuta et al. ................ 313/501
8,587,190 B2 * 11/2013 Takei et al. .................. 313/503
2007/0278930 A1 12/2007 Takahashi et al.
2010/0277059 A1 11/2010 Rains, Jr. et al.

FOREIGN PATENT DOCUMENTS

JP 11-258047 9/1999
JP 2010-176992 8/2010

OTHER PUBLICATIONS

EPO Search Report dated Nov. 11, 2013.

* cited by examiner

*Primary Examiner* — Karabi Guharay
(74) *Attorney, Agent, or Firm* — Greenblum & Bernstein, P.L.C.

(57) ABSTRACT

A lighting device is provided with a lighting unit including a light emitting element and fluorescent bodies, which emit light of different wavelengths when excited by light from the light emitting element. When a peak output value of emitted light is 100% in a range of 440-465 nm, the lighting unit emits light having an output value at 500 nm that is 35%-55%, an output value at 550 nm that is 45%-80%, an output value at 600 nm that is 45%-75%, and an output value at 640 nm that is 50%-80%. The lighting unit emits light having a color temperature of 4500-5500 K and with the output value at 640 nm in a range of 100%-120% relative to the output value at 600 nm and in a range of 85%-130% relative to the output value at 550 nm.

15 Claims, 6 Drawing Sheets

Fig.3

| Blue Light | Green Light | | Red Light | | Combined White Color | | |
|---|---|---|---|---|---|---|---|
| Peak Wavelength (nm) | Peak Wavelength (nm) | Half Value Width (nm) | Peak Wavelength (nm) | Halve Value Width (nm) | White Determination of 4200K/Duv=-5 | PS Value | Preferable Skin Appearance |
| 440 | 550 | 130 | 640 | 95 | YES | 90 | OK |
| 455 | 545 | 130 | 640 | 95 | YES | 95 | OK |
| 455 | 550 | 110 | 640 | 95 | YES | 95 | OK |
| 455 | 550 | 130 | 630 | 95 | YES | 94 | OK |
| 455 | 550 | 130 | 640 | 80 | YES | 94 | OK |
| 455 | 550 | 130 | 640 | 95 | YES | 97 | OK |
| 455 | 550 | 130 | 640 | 110 | YES | 95 | OK |
| 455 | 550 | 130 | 650 | 95 | YES | 95 | OK |
| 455 | 550 | 150 | 640 | 95 | YES | 98 | OK |
| 455 | 555 | 130 | 640 | 95 | YES | 97 | OK |
| 465 | 550 | 130 | 640 | 95 | YES | 98 | OK |
| 435 | 550 | 130 | 640 | 95 | NO | 88 | NG |
| 455 | 540 | 130 | 640 | 95 | NO | 94 | NG |
| 455 | 550 | 105 | 640 | 95 | NO | 95 | NG |
| 455 | 550 | 130 | 625 | 95 | NO | 94 | NG |
| 455 | 550 | 130 | 640 | 75 | NO | 94 | NG |
| 455 | 550 | 130 | 640 | 115 | NO | 95 | NG |
| 455 | 550 | 130 | 655 | 95 | NO | 95 | NG |
| 455 | 550 | 155 | 640 | 95 | NO | 98 | NG |
| 455 | 560 | 130 | 640 | 95 | NO | 98 | NG |
| 470 | 550 | 130 | 640 | 95 | NO | 98 | NG |

Fig.4

| Output Value at Each Wavelength Relative When Output Value at Wavelength 440 to 465 nm is 100 | | | | White Determination of 4200 K/Duv=-5 | PS Value | Preferable Skin Appearance |
|---|---|---|---|---|---|---|
| 490nm | 530nm | 630nm | Ratio of Output Value at 530 nm Relative to Output Value at 630 nm | | | |
| 46 | 59 | 75 | 80 | YES | 96 | OK |
| 46 | 59 | 85 | 70 | NO | 98 | NG |
| 46 | 59 | 95 | 63 | NO | 99 | NG |
| 47 | 62 | 79 | 79 | YES | 96 | OK |
| 48 | 62 | 85 | 73 | YES | 97 | OK |
| 48 | 62 | 92 | 68 | NO | 98 | NG |
| 49 | 65 | 82 | 79 | YES | 96 | OK |
| 49 | 65 | 86 | 76 | YES | 97 | OK |
| 49 | 65 | 89 | 73 | YES | 97 | OK |
| 51 | 68 | 76 | 89 | NO | 92 | NG |
| 51 | 68 | 80 | 86 | YES | 93 | OK |
| 51 | 68 | 83 | 82 | YES | 95 | OK |
| 51 | 68 | 86 | 79 | YES | 96 | OK |
| 51 | 68 | 90 | 76 | YES | 97 | OK |
| 51 | 68 | 93 | 74 | YES | 97 | OK |
| 51 | 68 | 96 | 71 | NO | 98 | NG |
| 53 | 71 | 84 | 85 | YES | 93 | OK |
| 53 | 71 | 87 | 82 | YES | 95 | OK |
| 53 | 71 | 90 | 79 | YES | 96 | OK |
| 54 | 74 | 81 | 92 | NO | 90 | NG |
| 54 | 74 | 87 | 85 | YES | 93 | OK |
| 54 | 74 | 94 | 79 | YES | 95 | OK |
| 56 | 77 | 78 | 98 | NO | 87 | NG |
| 56 | 77 | 88 | 88 | NO | 92 | NG |
| 56 | 77 | 98 | 79 | YES | 95 | OK |

Fig.9

| Color Temperature (K) | Output Value at Each Wavelength Relative When Output Value at Wavelength 440 to 465 nm is 100 | | | | Output Ratio (%) | | PS Value | Preferable Skin Appearance |
|---|---|---|---|---|---|---|---|---|
| | 500nm | 550nm | 600nm | 640nm | 640/600 | 640/550 | | |
| 5000 | 50 | 70 | 66 | 69 | 104 | 98 | 94 | OK |
| 5000 | 16 | 77 | 63 | 36 | 58 | 47 | 51 | NG |
| 5000 | 38 | 62 | 57 | 51 | 91 | 83 | 74 | NG |
| 4000 | 61 | 97 | 104 | 104 | 100 | 108 | 95 | OK |
| 4000 | 48 | 86 | 98 | 70 | 71 | 81 | 78 | NG |
| 3500 | 55 | 99 | 117 | 122 | 104 | 123 | 97 | OK |
| 3500 | 5 | 118 | 109 | 68 | 62 | 57 | 66 | NG |
| 3000 | 68 | 136 | 177 | 198 | 111 | 146 | 95 | OK |
| 3000 | 9 | 122 | 170 | 81 | 48 | 66 | 62 | NG |

LIGHTING DEVICE TO PRODUCE PREFERABLE PRECEPTION OF SKIN COLOR

CROSS-REFERENCE TO RELATED APPLICATIONS

This application is based upon and claims the benefit of priority from prior Japanese Patent Application No. 2012-179390, filed on Aug. 13, 2012, the entire contents of which are incorporated herein by reference.

BACKGROUND ART

The present invention relates to a lighting device.

Various types of known lighting devices, such as LED elements, put significance on high efficiency. In such a lighting device that puts significance on high efficiency, the device has an improved light emitting efficiency. However, due to low color rendering, when the light from the device reaches an object or a person, the color of the object or the skin color of the person may not be truly reproduced.

Japanese Laid-Open Patent Publication No. 2010-176992 discloses a lighting device that puts significance on high color rendering so that the color of an object and the skin color of a person may be truly reproduced. The lighting device takes into consideration, for example, a general color rendering index and special color rendering index No. 15 (R15).

The above lighting device is configured to truly reproduce the skin color of a person, that is, to have a high rendering index, by increasing the general color rendering index Ra and the special color rendering index No. 15 (R15). In addition to truly reproducing the skin color, it is desirable that a lighting device be developed so that skin is rendered with a preferable color.

SUMMARY OF THE INVENTION

A first aspect of the present invention is a lighting device provided with a lighting unit including a light emitting element and a plurality of fluorescent bodies, each emitting light of a different wavelength when excited by light from the light emitting element. Under an assumption that a peak output value of the emitted light is 100% in a range of wavelength 440 to 465 nm, the lighting unit is configured to emit light having an output value at wavelength 500 nm that is in a range from 35% to 55%, an output value at wavelength 550 nm that is in a range from 45% to 80%, an output value at wavelength 600 nm that is in a range from 45% to 75%, and an output value at wavelength 640 nm that is in a range from 50% to 80%. The lighting unit emits light having a color temperature of 4500 to 5500 K and with the output value at wavelength 640 nm in a range of 100% to 120% relative to the output value of light at wavelength 600 nm and in a range of 85% to 130% relative to the output value of light at wavelength 550 nm.

A second aspect of the present invention is a lighting device provided with a lighting unit including a light emitting element and a plurality of fluorescent bodies, each emitting light of a different wavelength when excited by light from the light emitting element. Under an assumption that a peak output value of the emitted light is 100% in a range of wavelength 440 to 465 nm, the lighting unit is configured to emit light having an output value at wavelength 500 nm that is in a range from 45% to 70%, an output value at wavelength 550 nm that is in a range from 60% to 105%, an output value at wavelength 600 nm that is in a range from 70% to 120%, and an output value at wavelength 640 nm that is in a range from 75% to 125%. The lighting unit emits light having a color temperature of 3500 to 4500 K and with the output value at wavelength 640 nm in a range of 85% to 110% relative to the output value of light at wavelength 600 nm and in a range of 95% to 135% relative to the output value of light at wavelength 550 nm.

A third aspect of the present invention is a lighting device provided with a lighting unit including a light emitting element and a plurality of fluorescent bodies, each emitting light of a different wavelength when excited by light from the light emitting element. Under an assumption that a peak output value of the emitted light is 100% in a range of wavelength 440 to 465 nm, the lighting unit is configured to emit light having an output value at wavelength 500 nm that is in a range from 40% to 65%, an output value at wavelength 550 nm that is in a range from 60% to 125%, an output value at wavelength 600 nm that is in a range from 80% to 145%, and an output value at wavelength 640 nm that is in a range from 85% to 155%. The lighting unit emits light having a color temperature of 3000 to 4000 K and with the output value at wavelength 640 nm in a range of 100% to 120% relative to the output value of light at wavelength 600 nm and in a range of 110% to 160% relative to the output value of light at wavelength 550 nm.

A fourth aspect of the present invention is a lighting device provided with a lighting unit including a light emitting element and a plurality of fluorescent bodies, each emitting light of a different wavelength when excited by light from the light emitting element. Under an assumption that a peak output value of the emitted light is 100% in a range of wavelength 440 to 465 nm, the lighting unit is configured to emit light having an output value at wavelength 500 nm that is in a range from 45% to 80%, an output value at wavelength 550 nm that is in a range from 80% to 160%, an output value at wavelength 600 nm that is in a range from 115% to 220%, and an output value at wavelength 640 nm that is in a range from 130% to 250%. The lighting unit emits light having a color temperature of 2500 to 3500 K and with the output value at wavelength 640 nm in a range of 100% to 125% relative to the output value of light at wavelength 600 nm and in a range of 135% to 185% relative to the output value of light at wavelength 550 nm.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a chart illustrating the effects of a characteristic change for each color of light;

FIG. 4 is a chart illustrating the effects of a characteristic change for each wavelength of a combined white color;

FIG. 9 is a chart illustrating the effects of a characteristic change for each wavelength of a combined white color.

DETAILED DESCRIPTION OF THE INVENTION

One embodiment of the present invention will now be described with reference to the drawings.

Figure 1:
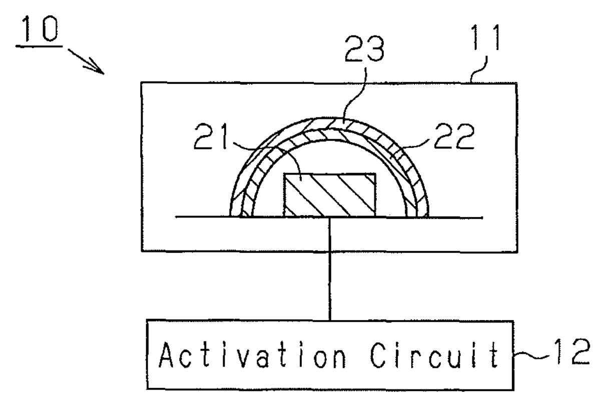
FIG. 1 is a schematic diagram of a lighting device according to one embodiment of the present invention.

Referring to FIG. 1, a lighting device 10 of the present embodiment includes a lighting unit 11 and an activation circuit 12. The lighting unit 11 radiates light to the exterior. The activation circuit 12 activates the lighting unit 11.

As shown in FIG. 1, the lighting unit 11 includes an LED element 21, which is electrically connected to the activation circuit 12, and fluorescent bodies 22 and 23. The LED element 21 includes a light emitting surface. Each of the fluorescent bodies 22 and 23 covers the light emitting surface of the LED element and is excited by the light from the LED element 21 to radiate light having different wavelengths. When supplied with power from the activation circuit 12, the lighting unit 11 is configured to generate generally white light.

The lighting unit 11 of the lighting device 10 will now be described in detail.

To configure the lighting unit 11, the inventors of the present invention have checked (1) whether or not the light from the lighting unit 11 may be considered as having the same color as 4200 K, which is an intermediate temperature for white color, and (2) the preference index of skin color PS (proposed by Tadashi Yano) for a Japanese female as a preference index for the appearance of the skin color of a person. Specifically, the inventors of the present invention have conducted experiments A and B, which will now be described.

Experiment A

The peak wavelength of the LED element 21, which emits blue light, and the peak wavelength and the half-value width of the fluorescent bodies 22 and 23 were changed, and it was determined whether or not the light from the lighting unit 11 was substantially the same color as light having a color shift Duv (deviation from Planckian locus) of −5 at color temperature 4200 K. The determination process is desirably performed using the 5 Standard Deviation of Color Matching (5SDCM) or 4SDCM accepted as the chromaticity tolerable range for various types of light source colors by the International Electrotechnical Commission (IEC) based on the chromaticity ellipse defined by MacAdam. However, the determination process is not particularly limited.

Further, the peak wavelength of the LED element 21, which emits blue light, and the peak wavelength and the half-value width of the fluorescent bodies 22 and 23 were changed, and the preference index of skin color PS was calculated for the light from the lighting unit 11. As disclosed in, for example, Japanese Laid-Open Patent Publication No. 11-258047, the preference index of skin color PS may be calculated by obtaining a calculation evaluation value P related to the preference of skin color and then performing the calculation of $4\times5^{P}$.

FIG. 3 shows the conditions obtained from the lighting unit 11 with light having a relatively high PS value and substantially the same color as light having a color shift Duv (deviation from Planckian locus) of −5 at color temperature 4200 K (white color). These conditions are as listed below.

Condition A1

Blue light had a peak wavelength of 440 nm, green light had a peak wavelength of 550 nm and a half-value width of 130 nm, red light had a peak wavelength of 640 nm and a half-value width of 95 nm.

Condition A2

Blue light had a peak wavelength of 455 nm, green light had a peak wavelength of 545 nm and a half-value width of 130 nm, red light had a peak wavelength of 640 nm and a half-value width of 95 nm.

Condition A3

Blue light had a peak wavelength of 455 nm, green light had a peak wavelength of 550 nm and a half-value width of 110 nm, red light had a peak wavelength of 640 nm and a half-value width of 95 nm.

Condition A4

Blue light had a peak wavelength of 455 nm, green light had a peak wavelength of 550 nm and a half-value width of 130 nm, red light had a peak wavelength of 630 nm and a half-value width of 95 nm.

Condition A5

Blue light had a peak wavelength of 455 nm, green light had a peak wavelength of 550 nm and a half-value width of 130 nm, red light had a peak wavelength of 640 nm and a half-value width of 80 nm.

Condition A6

Blue light had a peak wavelength of 455 nm, green light had a peak wavelength of 550 nm and a half-value width of 130 nm, red light had a peak wavelength of 640 nm and a half-value width of 95 nm.

Condition A7

Blue light had a peak wavelength of 455 nm, green light had a peak wavelength of 550 nm and a half-value width of 130 nm, red light had a peak wavelength of 640 nm and a half-value width of 110 nm.

Condition A8

Blue light had a peak wavelength of 455 nm, green light had a peak wavelength of 550 nm and a half-value width of 130 nm, red light had a peak wavelength of 650 nm and a half-value width of 95 nm.

Condition A9

Blue light had a peak wavelength of 455 nm, green light had a peak wavelength of 550 nm and a half-value width of 150 nm, red light had a peak wavelength of 640 nm and a half-value width of 95 nm.

Condition A10

Blue light had a peak wavelength of 455 nm, green light had a peak wavelength of 555 nm and a half-value width of 130 nm, red light had a peak wavelength of 640 nm and a half-value width of 95 nm.

Condition A11

Blue light had a peak wavelength of 465 nm, green light had a peak wavelength of 550 nm and a half-value width of 130 nm, red light had a peak wavelength of 640 nm and a half-value width of 95 nm.

The following requirements may be derived from the above conditions. Blue light has a peak wavelength in the range from 440 to 465 nm. Green light has a peak wavelength in the range from 545 to 555 nm and a half-value width in the range from 110 to 150 nm. Red light has a peak wavelength in the range from 630 to 650 nm and a half-value width in the range from 80 to 110 nm.

Experiment B

The output value (light intensity) of each of three wavelengths in the light from the lighting unit 11 including the LED element 21 and the fluorescent bodies 22 and 23 were changed, and it was determined whether or not the light from the lighting unit 11 was substantially the same color as light having a color shift Duv (deviation from Planckian locus) of −5 at color temperature 4200 K. Further, the output value of each of three wavelengths in the light from the lighting unit 11 including the LED element 21 and the fluorescent bodies 22 and 23 were changed, and the preference index of skin color PS was calculated for the light from the lighting unit 11.

FIG. 4 shows the conditions obtained from the lighting unit 11 with light having a relatively high PS value and substantially the same color as light having a color shift Duv (deviation from Planckian locus) of −5 at color temperature 4200 K (white color). These conditions are as listed below. The three wavelengths include the wavelengths of 490 nm, 530 nm, and 630 nm. The output value of each wavelength is expressed by a rate assuming that the output value of the blue light is 100% for the wavelengths from 440 to 465 nm.

Condition B1

The output value at wavelength 490 nm was 46%, the output value at wavelength 530 nm was 59%, the output value at wavelength 630 nm was 75%, and the ratio of the output value at wavelength 530 nm to the output value at wavelength 630 nm was 80%.

Condition B2

The output value at wavelength 490 nm was 47%, the output value at wavelength 530 nm was 62%, the output value at wavelength 630 nm was 79%, and the ratio of the output value at wavelength 530 nm to the output value at wavelength 630 nm was 79%.

Condition B3

The output value at wavelength 490 nm was 48%, the output value at wavelength 530 nm was 62%, the output value at wavelength 630 nm was 85%, and the ratio of the output value at wavelength 530 nm to the output value at wavelength 630 nm was 73%.

Condition B4

The output value at wavelength 490 nm was 49%, the output value at wavelength 530 nm was 65%, the output value at wavelength 630 nm was 82%, and the ratio of the output value at wavelength 530 nm to the output value at wavelength 630 nm was 79%.

Condition B5

The output value at wavelength 490 nm was 49%, the output value at wavelength 530 nm was 65%, the output value at wavelength 630 nm was 86%, and the ratio of the output value at wavelength 530 nm to the output value at wavelength 630 nm was 76%.

Condition B6

The output value at wavelength 490 nm was 49%, the output value at wavelength 530 nm was 65%, the output value at wavelength 630 nm was 89%, and the ratio of the output value at wavelength 530 nm to the output value at wavelength 630 nm was 73%.

Condition B7

The output value at wavelength 490 nm was 51%, the output value at wavelength 530 nm was 68%, the output value at wavelength 630 nm was 80%, and the ratio of the output value at wavelength 530 nm to the output value at wavelength 630 nm was 86%.

Condition B8

The output value at wavelength 490 nm was 51%, the output value at wavelength 530 nm was 68%, the output value at wavelength 630 nm was 83%, and the ratio of the output value at wavelength 530 nm to the output value at wavelength 630 nm was 82%.

Condition B9

The output value at wavelength 490 nm was 51%, the output value at wavelength 530 nm was 68%, the output value at wavelength 630 nm was 86%, and the ratio of the output value at wavelength 530 nm to the output value at wavelength 630 nm was 79%.

Condition B10

The output value at wavelength 490 nm was 51%, the output value at wavelength 530 nm was 68%, the output value at wavelength 630 nm was 90%, and the ratio of the output value at wavelength 530 nm to the output value at wavelength 630 nm was 76%.

Condition B11

The output value at wavelength 490 nm was 51%, the output value at wavelength 530 nm was 68%, the output value at wavelength 630 nm was 93%, and the ratio of the output value at wavelength 530 nm to the output value at wavelength 630 nm was 74%.

Condition B12

The output value at wavelength 490 nm was 53%, the output value at wavelength 530 nm was 71%, the output value at wavelength 630 nm was 84%, and the ratio of the output value at wavelength 530 nm to the output value at wavelength 630 nm was 85%.

Condition B13

The output value at wavelength 490 nm was 53%, the output value at wavelength 530 nm was 71%, the output value at wavelength 630 nm was 87%, and the ratio of the output value at wavelength 530 nm to the output value at wavelength 630 nm was 82%.

Condition B14

The output value at wavelength 490 nm was 53%, the output value at wavelength 530 nm was 71%, the output value at wavelength 630 nm was 90%, and the ratio of the output value at wavelength 530 nm to the output value at wavelength 630 nm was 79%.

Condition B15

The output value at wavelength 490 nm was 54%, the output value at wavelength 530 nm was 74%, the output value at wavelength 630 nm was 87%, and the ratio of the output value at wavelength 530 nm to the output value at wavelength 630 nm was 85%.

Condition B16

The output value at wavelength 490 nm was 54%, the output value at wavelength 530 nm was 74%, the output value at wavelength 630 nm was 94% and the ratio of the output value at wavelength 530 nm to the output value at wavelength 630 nm was 79%.

Condition B17

The output value at wavelength 490 nm was 56%, the output value at wavelength 530 nm was 77%, the output value at wavelength 630 nm was 98% and the ratio of the output value at wavelength 530 nm to the output value at wavelength 630 nm was 79%.

Under conditions B1 to B17, the lighting unit 11 satisfied each of the next conditions.

Common Condition

Under the assumption that the peak output value (intensity) of the emitted light is 100% in the range from wavelength 440 nm to 465 nm, the output value of the light at wavelength 500 nm was in the range from 45% to 70%, the output value of the light at wavelength 550 nm was in the range of 60% to 105%, the output value of the light at wavelength 600 nm was in the range of 70% to 120%, and the output value of the light at wavelength 640 nm was in the range from 75% to 125%. Further, the output value of the light at wavelength 640 nm relative to the output value of the light at wavelength 600 nm was 85% to 110%, and the output value of the light at wavelength 640 nm relative to the output value of the light at wavelength 550 nm was 95% to 135%.

Figure 2:
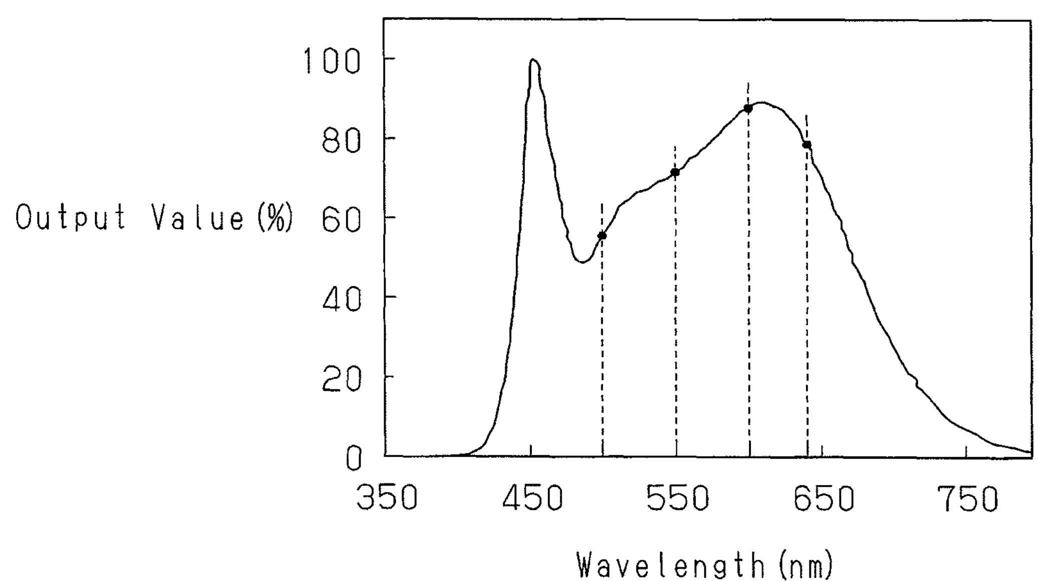
FIG. 2 is a graph showing one example of the output value characteristics of light from a lighting unit.

In the present embodiment, the lighting unit 11 is configured to have, for example, the output characteristics shown in FIG. 2 based on the requirements derived from experiment A and experiment B.

More specifically, the LED element 21 of the lighting unit 11 emits blue light having a light emission center wavelength (peak wavelength) at 455 nm and a half value width of 30 nm. Further, in the lighting unit 11, the fluorescent body 22 receives light from the LED element 21 and emits green light, and the fluorescent body 23 receives light from the LED element 21 and emits red light. The fluorescent body 22 includes $CaSc_2O_4$:Ce (calcium scandate-cerium additive) that emits green light having a peak wavelength at 550 nm a half value width of 130 nm. The fluorescent body 23 includes a mixture of $CaAlSiN_3$:Eu (calcium aluminum silicon nitride-europium additive) and $(Sr,Ca)AlSiN_3$:Eu (strontium calcium aluminum silicon nitride-europium additive) that emits red light having a peak wavelength at 640 nm and a half value width of 95 nm.

The fluorescent body 22 that emits green light and the fluorescent body 23 that emits red light are mixed to obtain a ratio by weight of 100 to 23 and dispersed in silicon resin before being molded integrally.

Under the assumption that the output value of the blue light having a peak wavelength at 455 nm is 100%, the lighting unit 11 including the LED element 21 and the fluorescent bodies 22 and 23 is configured to emit light having an output value that is approximately 55% at wavelength 500 nm, approximately 70% at wavelength 550 nm, approximately 87% at wavelength 600 nm, and approximately 78% at wavelength 640 nm. The lighting unit 11 is configured to emit light having an output value at wavelength 640 nm that is approximately 90%, which is in the range from 85% to 110%, relative to the output value of the light at wavelength length 600 nm, and approximately 111%, which is in the range from 95% to 135%, relative to the output value of the light at wavelength length 550 nm.

An example of the operation of the lighting device 10 in the present embodiment will now be described.

In the lighting device 10 of the present embodiment, blue light is emitted from the LED element 21 of the lighting unit 11 by the activation circuit 12. Some of the light is absorbed by the fluorescent bodies 22 and 23, which emit light having longer wavelengths (red light or green light). Further, the lighting unit 11 combines the blue light, green light, and red light to emit white light having a color shift Duv of −5 at a color temperature of approximately 4200 K. Here, the preference of skin color PS for the emitted light is 95.

The present embodiment has the advantages described below.

(1) The lighting device 10 includes the LED element 21 and the fluorescent bodies 22 and 23. The LED element 21 emits blue light having a peak wavelength at 455 nm and a half value width of 30 nm. The fluorescent body 22 is excited by the light from the LED element 21 and emits light having a peak wavelength at 550 nm and a half value width of 130 nm. The fluorescent body 23 is excited by the light from the LED element 21 and emits light having a peak wavelength at 640 nm and a half value width of 95 nm. Further, under the assumption that the output value of the blue light having a peak wavelength at 455 nm is 100%, the lighting unit 11 is configured to emit light having an output value that is approximately 55% at wavelength 500 nm, approximately 70% at wavelength 550 nm, approximately 87% at wavelength 600 nm, and approximately 78% at wavelength 640 nm. The lighting unit 11 is configured to emit light at wavelength 640 nm having an output value that is approximately 90%, which is in the range from 85% to 110%, relative to the output value of the light at wavelength length 600 nm, and approximately 111%, which is in the range from 95% to 135%, relative to the output value of the light at wavelength length 550 nm. This configuration realizes light having a color shift Duv of −5 at a color temperature of approximately 4200 K and a preference of skin color PS of 95. Thus, with a warm white light source, which is often used in commercial facilities or the like, the skin color of a person may have a preferable appearance. By showing the skin with a preferable appearance, a female would appear more beautiful and a person would appear healthier. This would make everyone feel good and happy. When using the lighting device 10 for a studio or a stage, the skin color of a person in the studio or on the stage would have a further preferable appearance and enable further beautiful photographs to be taken.

(2) The fluorescent body 22 that emits green light includes $CaSc_2O_4$:Ce (calcium scandate-cerium additive) and resists temporal changes resulting from the environmental load (temperature and humidity). Thus, the durability of the fluorescent body 22 may be increased, while allowing for a stable preferable skin appearance.

(3) The fluorescent body 23 that emits red light includes a mixture of $CaAlSiN_3$:Eu (calcium aluminum silicon nitride-europium additive) and (Sr,Ca)$AlSiN_3$:Eu (strontium calcium aluminum silicon nitride-europium additive). In this case, $CaAlSiN_3$:Eu (calcium aluminum silicon nitride-europium additive) and (Sr,Ca)$AlSiN_3$:Eu (strontium calcium aluminum silicon nitride-europium additive) resist temporal changes resulting from the environmental load (temperature and humidity). The use of such materials increases the durability of the fluorescent body 23, while allowing for a stable preferable skin appearance.

(4) The fluorescent body 22 and the fluorescent body 23 are combined so that the weight of the fluorescent body 23, which emits red light, relative to the weight of the fluorescent body 22, which emits green light is 23%. This stably realizes the highly efficient lighting device 10 that emits light having a color temperature of 4200 K, a color shift Duv of −5, and a preference index of skin color PS of 95.

(5) The use of the LED element 21 lowers energy consumption as compared with when using a fluorescent lamp or an incandescent bulb as the light source.

It should be apparent to those skilled in the art that the present invention may be embodied in many other specific forms without departing from the spirit or scope of the invention. Particularly, it should be understood that the present invention may be embodied in the following forms.

In the above embodiment, the lighting unit 11 is configured so that the color temperature of the emitted light is approximately 4200 K. However, there is no such limitation.

For example, when the lighting unit 11 emits light having a color temperature of 4500 to 5500 K, light having the median value of 5000 K may be used. As shown in FIG. 9, the conditions and comparative examples for this case will now be described.

Condition C1

Figure 5:
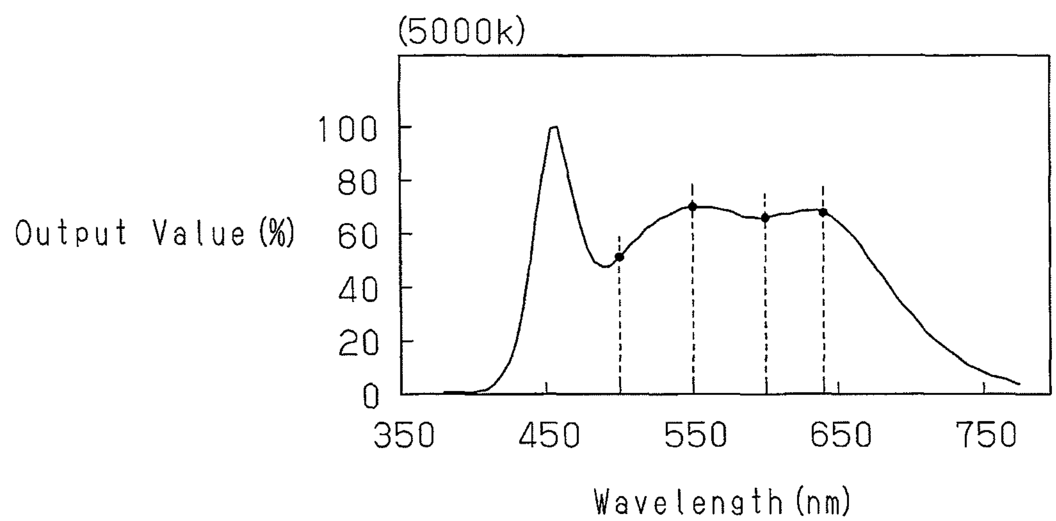
FIG. 5 is a graph showing one example of the output value characteristics of light from the lighting unit.

Under the assumption that the peak output value of the emitted light was 100% in the range of wavelength 440 to 465 nm, the output value of the light at wavelength 500 nm was 50%, and the output value of the light at wavelength 550 nm was 70%. Under the assumption that the peak output value of the emitted light was 100% in the range of wavelength 440 to 465 nm, the output value of the light at wavelength 600 nm was 66%, and the output value of the light at wavelength 640 nm was 69%. Further, the output value of the light at wavelength 640 nm relative to the output value of the light at wavelength 600 nm was 104%, and the output value of the light at wavelength 640 nm relative to the output value of the light at wavelength 550 nm was 98%. FIG. 5 shows the spectral distribution.

Comparative Example C2

Under the assumption that the peak output value of the emitted light was 100% in the range of wavelength 440 to 465 nm, the output value of the light at wavelength 500 nm was 16%, and the output value of the light at wavelength 550 nm was 77%. Under the assumption that the peak output value of the emitted light was 100% in the range of wavelength 440 to 465 nm, the output value of the light at wavelength 600 nm was 63%, and the output value of the light at wavelength 640 nm was 36%. Further, the output value of the light at wavelength 640 nm relative to the output value of the light at wavelength 600 nm was 58%, and the output value of the light at wavelength 640 nm relative to the output value of the light at wavelength 550 nm was 47%.

Comparative Example C3

Under the assumption that the peak output value of the emitted light was 100% in the range of wavelength 440 to 465 nm, the output value of the light at wavelength 500 nm was 38%, and the output value of the light at wavelength 550 nm was 62%. Under the assumption that the peak output value of the emitted light was 100% in the range of wavelength 440 to 465 nm, the output value of the light at wavelength 600 nm was 57%, and the output value of the light at wavelength 640 nm was 51%. Further, the output value of the light at wavelength 640 nm relative to the output value of the light at wavelength 600 nm was 91%, and the output value of the light at wavelength 640 nm relative to the output value of the light at wavelength 550 nm was 83%.

The preference index of skin color PS was 94 and high under condition C1 as compared with comparison examples C2 and C3. Accordingly, it may be determined that the appearance of skin is preferable. Further, based on condition C1 and comparative examples C2 and C3, when outputting light having a color temperature of 4500 to 5500 K, the preferable conditions are as described below.

Under the assumption that the peak output value of the emitted light is 100% in the range of wavelength 440 to 465 nm, the lighting unit 11 is configured so that the output value of the emitted light at wavelength 500 nm is in the range from 35% to 55%, and the output value of the light at wavelength 550 nm is in the range from 45% to 80%. Further, under the assumption that the peak output value of the emitted light is 100% in the range from wavelength 440 to 465 nm, the output value of the emitted light at wavelength 600 nm is in the range of 45% to 75%, and the output value of the emitted light at wavelength 640 nm is in the range from 50% to 80%. The lighting unit 11 is configured so that the output value of the light at wavelength 640 nm relative to the output value of the light at wavelength 600 nm is in the range from 100% to 120%, and the output value of the light at wavelength 640 nm relative to the output value of the light at wavelength 550 nm is in the range from 85% to 130%.

When the lighting unit 11 emits light having a color temperature of 3500 to 4500 K, light having the median value of 4000 K may be used. This configuration includes the above embodiment. As shown in FIG. 9, the conditions and comparative examples for this case will now be described.

Condition D1

Figure 6:
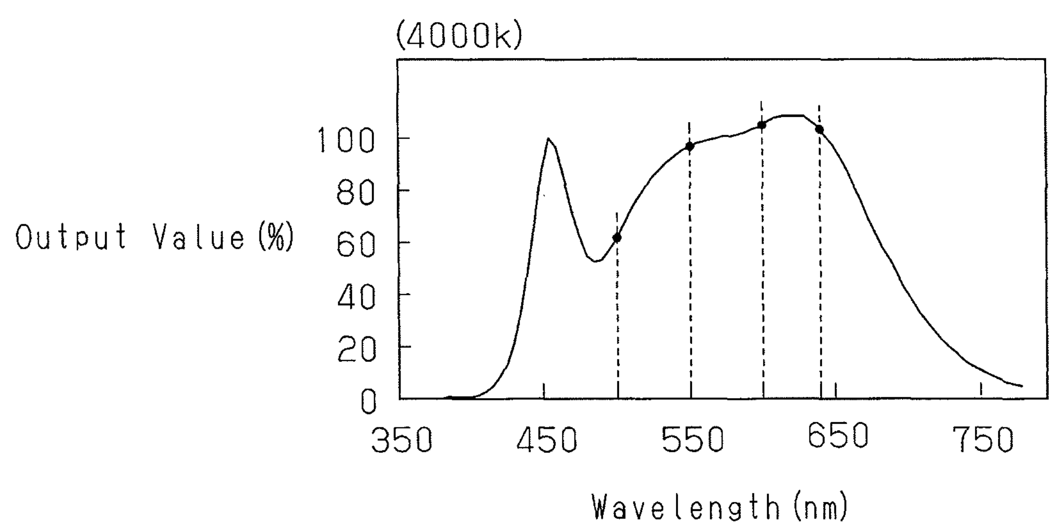
FIG. 6 is a graph showing one example of the output value characteristics of light from the lighting unit.

Under the assumption that the peak output value of the emitted light was 100% in the range of wavelength 440 to 465 nm, the output value of the light at wavelength 500 nm was 61%, and the output value of the light at wavelength 550 nm was 97%. Under the assumption that the peak output value of the emitted light was 100% in the range of wavelength 440 to 465 nm, the output value of the light at wavelength 600 nm was 104%, and the output value of the light at wavelength 640 nm was 104%. Further, the output value of the light at wavelength 640 nm relative to the output value of the light at wavelength 600 nm was 100%, and the output value of the light at wavelength 640 nm relative to the output value of the light at wavelength 550 nm was 108%. FIG. 6 shows the spectral distribution.

Comparative Example D2

Under the assumption that the peak output value of the emitted light was 100% in the range of wavelength 440 to 465 nm, the output value of the light at wavelength 500 nm was 48%, and the output value of the light at wavelength 550 nm was 86%. Under the assumption that the peak output value of the emitted light was 100% in the range of wavelength 440 to 465 nm, the output value of the light at wavelength 600 nm was 98%, and the output value of the light at wavelength 640 nm was 70%. Further, the output value of the light at wavelength 640 nm relative to the output value of the light at wavelength 600 nm was 71%, and the output value of the light at wavelength 640 nm relative to the output value of the light at wavelength 550 nm was 81%.

The preference index of skin color PS was 95 and high under condition D1 as compared with comparison example D2. Accordingly, it may be determined that the appearance of skin is preferable. Further, based on condition D1 and comparative example D2, when outputting light having a color temperature of 3500 to 4500 K, the preferable conditions are as described below.

Under the assumption that the peak output value of the emitted light is 100% in the range of wavelength 440 to 465 nm, the lighting unit 11 is configured so that the output value of the emitted light at wavelength 500 nm is in the range from 45% to 70%, and the output value of the light at wavelength 550 nm is in the range from 60% to 105%. Further, under the assumption that the peak output value of the emitted light is 100% in the range from wavelength 440 to 465 nm, the output value of the emitted light at wavelength 600 nm is in the range of 70% to 120%, and the output value of the emitted light at wavelength 640 nm is in the range from 75% to 125%. The lighting unit 11 is configured so that the output value of the light at wavelength 640 nm relative to the output value of the light at wavelength 600 nm is in the range from 85% to 110%, and the output value of the light at wavelength 640 nm relative to the output value of the light at wavelength 550 nm is in the range from 95% to 135%.

When the lighting unit 11 emits light having a color temperature of 3000 to 4000 K, light having the median value of 3500 K may be used. As shown in FIG. 9, the conditions and comparative examples for this case will now be described.

Condition E1

Figure 7:
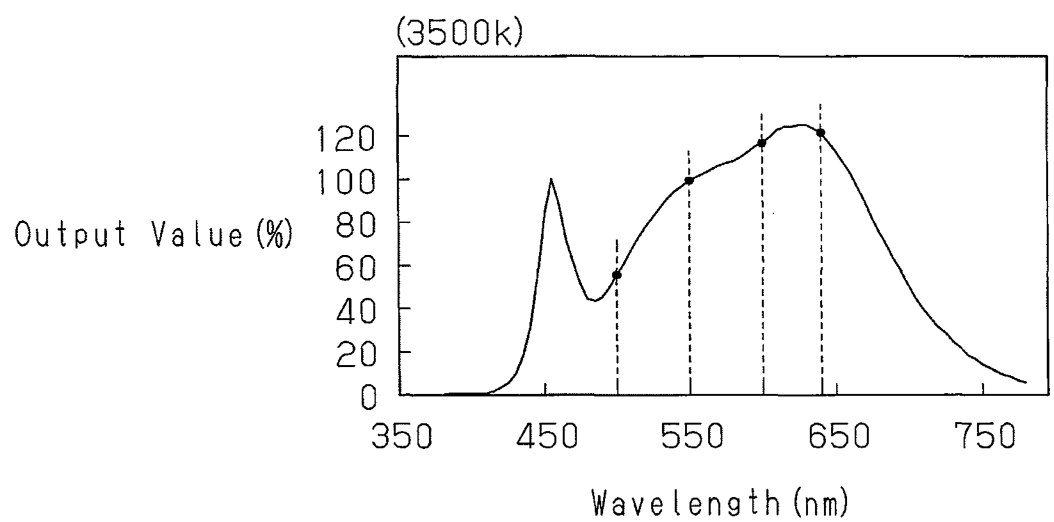
FIG. 7 is a graph showing one example of the output value characteristics of light from the lighting unit.

Under the assumption that the peak output value of the emitted light was 100% in the range of wavelength 440 to 465 nm, the output value of the light at wavelength 500 nm was 55%, and the output value of the light at wavelength 550 nm was 99%. Under the assumption that the peak output value of the emitted light was 100% in the range of wavelength 440 to 465 nm, the output value of the light at wavelength 600 nm was 117%, and the output value of the light at wavelength 640 nm was 122%. Further, the output value of the light at wavelength 640 nm relative to the output value of the light at wavelength 600 nm was 104%, and the output value of the light at wavelength 640 nm relative to the output value of the light at wavelength 550 nm was 123%. FIG. 7 shows the spectral distribution.

Comparative Example E2

Under the assumption that the peak output value of the emitted light was 100% in the range of wavelength 440 to 465 nm, the output value of the light at wavelength 500 nm was 5%, and the output value of the light at wavelength 550 nm was 118%. Under the assumption that the peak output value of the emitted light was 100% in the range of wavelength 440 to 465 nm, the output value of the light at wavelength 600 nm was 109%, and the output value of the light at wavelength 640 nm was 68%. Further, the output value of the light at wavelength 640 nm relative to the output value of the light at wavelength 600 nm was 62%, and the output value of the light at wavelength 640 nm relative to the output value of the light at wavelength 550 nm was 57%.

When assuming that the output value of the light at the emission peak in the range of wavelength 440 to 465 nm is 100%, the preference index of skin color PS was 97 and high under condition E1 as compared with comparison example E2. Accordingly, it may be determined that the appearance of skin is preferable. Further, based on condition E1 and comparative example E2, when outputting light having a color temperature of 3000 to 4000 K, the preferable conditions are as described below.

Under the assumption that the peak output value of the emitted light is 100% in the range of wavelength 440 to 465 nm, the lighting unit 11 is configured so that the output value of the emitted light at wavelength 500 nm is in the range from 40% to 65%, and the output value of the light at wavelength 550 nm is in the range from 60% to 125%. Further, under the assumption that the peak output value of the emitted light is 100% in the range from wavelength 440 to 465 nm, the output value of the emitted light at wavelength 600 nm is in the range of 80% to 145%, and the output value of the emitted light at wavelength 640 nm is in the range from 85% to 155%. The lighting unit 11 is configured so that the output value of the light at wavelength 640 nm relative to the output value of the light at wavelength 600 nm is in the range from 100% to 120%, and the output value of the light at wavelength 640 nm relative to the output value of the light at wavelength 550 nm is in the range from 110% to 160%.

When the lighting unit 11 emits light having a color temperature of 3000 to 4000 K, light having the median value of 3500 K may be used. As shown in FIG. 9, the conditions and comparative examples for this case will now be described.

Condition F1

Figure 8:
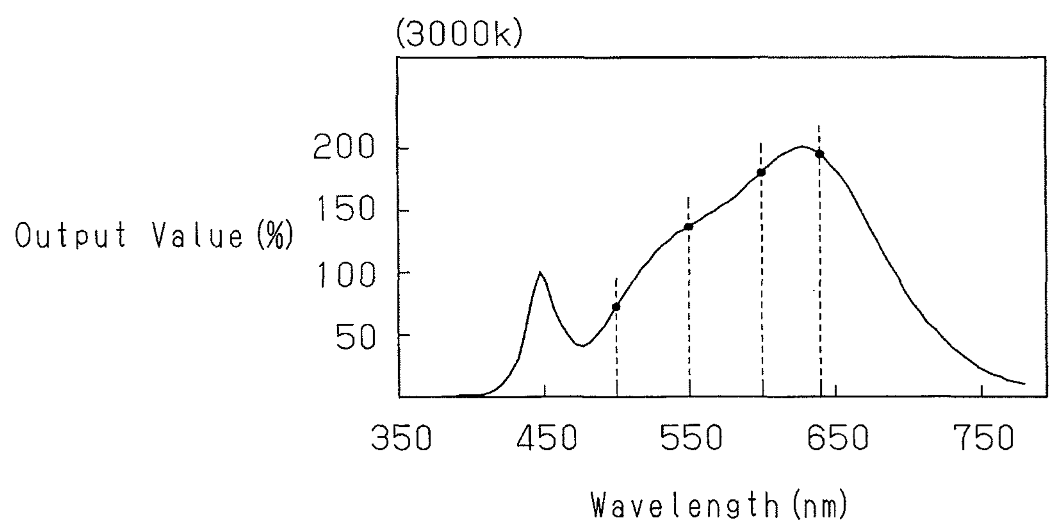
FIG. 8 is a graph showing one example of the output value characteristics of light from the lighting unit.

Under the assumption that the peak output value of the emitted light was 100% in the range of wavelength 440 to 465 nm, the output value of the light at wavelength 500 nm was 68%, and the output value of the light at wavelength 550 nm was 136%. Under the assumption that the peak output value of the emitted light was 100% in the range of wavelength 440 to 465 nm, the output value of the light at wavelength 600 nm was 177%, and the output value of the light at wavelength 640 nm was 198%. Further, the output value of the light at wavelength 640 nm relative to the output value of the light at wavelength 600 nm was 111%, and the output value of the light at wavelength 640 nm relative to the output value of the light at wavelength 550 nm was 146%. FIG. 8 shows the spectral distribution.

Comparative Example F2

Under the assumption that the peak output value of the emitted light was 100% in the range of wavelength 440 to 465 nm, the output value of the light at wavelength 500 nm was 9%, and the output value of the light at wavelength 550 nm was 122%. Under the assumption that the peak output value of the emitted light was 100% in the range of wavelength 440 to 465 nm, the output value of the light at wavelength 600 nm was 170%, and the output value of the light at wavelength 640 nm was 81%. Further, the output value of the light at wavelength 640 nm relative to the output value of the light at wavelength 600 nm was 48%, and the output value of the light at wavelength 640 nm relative to the output value of the light at wavelength 550 nm was 66%.

The preference index of skin color PS was 95 and high under condition F1 as compared with comparison example F2. Accordingly, it may be determined that the appearance of skin is preferable. Further, based on condition F1 and comparative example F2, when outputting light having a color temperature of 2500 to 3500 K, the preferable conditions are as described below.

Under the assumption that the peak output value of the emitted light is 100% in the range of wavelength 440 to 465 nm, the lighting unit 11 is configured so that the output value of the emitted light at wavelength 500 nm is in the range from 45% to 80%, and the output value of the light at wavelength 550 nm is in the range from 80% to 160%. Further, under the assumption that the peak output value of the emitted light is 100% in the range from wavelength 440 to 465 nm, the output value of the emitted light at wavelength 600 nm is in the range of 115% to 220%, and the output value of the emitted light at wavelength 640 nm is in the range from 130% to 250%. The lighting unit 11 is configured so that the output value of the light at wavelength 640 nm relative to the output value of the light at wavelength 600 nm is in the range from 100% to 125%, and the output value of the light at wavelength 640 nm relative to the output value of the light at wavelength 550 nm is in the range from 135% to 185%.

In the above embodiment, the LED element 21 is configured to emit light having a peak wavelength at 455 nm and a half value width of 30 nm. However, the LED element 21 only needs to emit light having a peak wavelength in the range from 440 to 465 nm and a half value width in the range from 20 to 40 nm. Preferably, the LED element 21 is configured to emit light having a peak wavelength in the range from 445 to 460 nm.

In the above embodiment, the fluorescent body 22 that emits green light is configured to emit light having a peak wavelength at 550 nm and a half value width of 130 nm. However, the fluorescent body 22 only needs to emit light having a peak wavelength in the range from 545 to 555 nm and a half value width in the range from 110 to 150 nm. Preferably, the fluorescent body 22 is configured to emit light having a peak wavelength in the range from 547 to 553 nm and a half value width in the range from 120 to 140 nm.

In the above embodiment, the fluorescent body 23 that emits red light is configured to emit light having a peak wavelength at 640 nm and a half value width of 95 nm. However, the fluorescent body 23 only needs to emit light having a peak wavelength in the range from 630 to 650 nm and a half value width in the range from 80 to 110 nm. Preferably, the fluorescent body 23 is configured to emit light having a peak wavelength in the range from 635 to 645 nm and a half value width in the range from 80 to 110 nm.

In the above embodiment, the fluorescent body 22 that radiates green light includes calcium scandate-cerium additive. Instead, the fluorescent body 22 may be, for example, a silicate-europium additive fluorescent body, a silicate-cerium additive fluorescent body, an aluminate-cerium additive fluorescent body, a scandate-cerium additive fluorescent body, an oxynitride-europium additive fluorescent body, or a thiogallate-europium additive fluorescent body.

In the above embodiment, the fluorescent body 23 that radiates red light includes a mixture of calcium aluminum silicon nitride-europium additive and strontium calcium aluminum silicon nitride-europium additive. Instead, the fluorescent body 23 may be, for example, a nitride-europium additive fluorescent body, an oxynitride-europium additive fluorescent body, a sulfide-europium additive fluorescent body, a silicate-europium additive fluorescent body, or at least one of calcium aluminum silicon nitride-europium additive and strontium calcium aluminum silicon nitride-europium additive.

In the above embodiment, the fluorescent body 22 and the fluorescent body 23 are combined so that the weight of the fluorescent body 23, which emits red light, relative to the weight of the fluorescent body 22, which emits green light is 23%. Instead, the fluorescent body 22 and the fluorescent body 23 may be combined so that the weight of the fluorescent body 23 relative to the weight of the fluorescent body 22 is in a range from 20% to 27%.

In the above embodiment, under the assumption that the peak output value of the emitted light at 455 nm is 100%, the lighting unit 11 is configured to emit light so that the output value at wavelength 490 nm is 51%, the output value at wavelength 530 nm is 68%, and the output value at wavelength 630 nm is 86%. However, the lighting unit 11 only needs to be configured to emit light so that when assuming that the peak output value of the emitted light is 100% in the range of wavelength 440 to 465 nm, the output value at wavelength 490 nm is in the range from 45% to 57%, the output value at wavelength 530 nm is in the range from 58% to 78%, and the output value at wavelength 630 nm is in the range from 75% to 100%. Further, the lighting unit 11 may be configured to emit light having an output value at wavelength 630 nm in a range from 72% to 87% relative to an output value of light at wavelength 530 nm.

In the above embodiment, the light emitting element includes the LED element 21. Instead, the light emitting element may include another light emitting element such as an organic electroluminescence (EL) element.

Technical concepts that may be recognized from the above embodiment will now be described.

(a) The lighting device according to claim 2, wherein the lighting unit emits light combining blue light having a peak wavelength in a range from 440 to 465 nm and a half value width in a range of 20 to 40 nm, green light having a peak wavelength in a range from 545 to 555 nm and a half value width in a range of 110 to 150 nm, and red light having a peak wavelength in a range from 630 to 650 nm and a half value width in a range of 80 to 110 nm; and under an assumption that a peak output value of light is 100% in a range of wavelength 440 to 465 nm, the light emitted from the lighting unit has an output value at wavelength 490 nm in a range from 45% to 57%, an output value at wavelength 530 nm in a range from 58% to 78%, an output value at wavelength 630 nm in a range from 75% to 100%, and the output value at wavelength 630 nm relative to the output value at wavelength 530 nm is in a range from 72% to 87%.

(b) The lighting device according to concept (a), wherein the light emitting element is an LED element emitting blue light having a peak wavelength in a range from 440 to 465 nm and a half value width in a range of 20 to 40 nm; and the fluorescent bodies include a fluorescent body that emits green light having a peak wavelength in a range from 545 to 555 nm and a half value width in a range of 110 to 150 nm, and a fluorescent body that emits red light having a peak wavelength in a range from 630 to 650 nm and a half value width in a range from 80 to 110 nm.

(c) The lighting device according to concept (b), wherein the fluorescent body that emits the green light includes calcium scandate-cerium additive.

(d) The lighting device according to concept (b) or (c), wherein the fluorescent body that emits the red light includes at least one of calcium aluminum silicon nitride-europium additive and strontium calcium aluminum silicon nitride-europium additive.

(e) The lighting device according to any one of concepts (b) to (d), wherein under an assumption that the fluorescent body that emits the green light has a weight of 100%, the fluorescent body that emits the red light has a weight in a range from 20% to 27%.

The present examples and embodiments are to be considered as illustrative and not restrictive, and the invention is not to be limited to the details given herein, but may be modified within the scope and equivalence of the appended claims.

The invention claimed is:

1. A lighting device comprising a lighting unit including a light emitting element, and a plurality of fluorescent bodies, each emitting light of a different wavelength when excited by light from the light emitting element, wherein under an assumption that a peak output value of the emitted light is 100% in a range of wavelength 440 to 465 nm, the lighting unit is configured to emit light having an output value at wavelength 500 nm that is in a range from 35% to 55%, an output value at wavelength 550 nm that is in a range from 45% to 80%, an output value at wavelength 600 nm that is in a range from 45% to 75%, and an output value at wavelength 640 nm that is in a range from 50% to 80%, and the lighting unit emits light having a color temperature of 4500 to 5500 K and with the output value at wavelength 640 nm in a range of 100% to 120% relative to the output value of light at wavelength 600 nm and in a range of 85% to 130% relative to the output value of light at wavelength 550 nm.

2. The lighting device according to claim 1, wherein the light emitting element includes an LED element that emits blue light having a peak wavelength in a range from 440 to 465 nm and a half width value in a range from 20 to 40 nm.

3. The lighting device according to claim 1, wherein the fluorescent bodies includes a fluorescent body that emits green light when excited by light from the light emitting element, wherein the green light has a peak wavelength in a range from 545 to 555 nm and a half value width in a range from 110 to 150 nm, and a fluorescent body that emits red light when excited by light from the light emitting element, wherein the red light has a peak wavelength in a range from 630 to 650 nm and a half value width in a range from 80 to 110 nm.

4. The lighting device according to claim 3, wherein the fluorescent body that emits green light includes calcium scandate-cerium additive.

5. The lighting device according to claim 3, wherein the fluorescent body that emits red light includes a mixture of calcium aluminum silicon nitride-europium additive and strontium calcium aluminum silicon nitride-europium additive.

6. The lighting device according to claim 3, wherein under an assumption that weight of the fluorescent body that emits green light is 100%, weight of the fluorescent body that emits red light is in a range from 20% to 27%.

7. A lighting device comprising a lighting unit including a light emitting element, and a plurality of fluorescent bodies, each emitting light of a different wavelength when excited by light from the light emitting element, wherein under an assumption that a peak output value of the emitted light is 100% in a range of wavelength 440 to 465 nm, the lighting unit is configured to emit light having an output value at wavelength 500 nm that is in a range from 45% to 70%, an output value at wavelength 550 nm that is in a range from 60% to 105%, an output value at wavelength 600 nm that is in a range from 70% to 120%, and an output value at wavelength 640 nm that is in a range from 75% to 125%, and the lighting unit emits light having a color temperature of 3500 to 4500 K and with the output value at wavelength 640 nm in a range of 85% to 110% relative to the output value of light at wavelength 600 nm and in a range of 95% to 135% relative to the output value of light at wavelength 550 nm.

8. The lighting device according to claim 7, wherein the light emitting element includes an LED element that emits blue light having a peak wavelength in a range from 440 to 465 nm and a half width value in a range from 20 to 40 nm.

9. The lighting device according to claim 7, wherein the fluorescent bodies includes a fluorescent body that emits green light when excited by light from the light emitting element, wherein the green light has a peak wavelength in a range from 545 to 555 nm and a half value width in a range from 110 to 150 nm, and a fluorescent body that emits red light when excited by light from the light emitting element, wherein the red light has a peak wavelength in a range from 630 to 650 nm and a half value width in a range from 80 to 110 nm.

10. A lighting device comprising a lighting unit including a light emitting element, and a plurality of fluorescent bodies, each emitting light of a different wavelength when excited by light from the light emitting element, wherein under an assumption that a peak output value of the emitted light is 100% in a range of wavelength 440 to 465 nm, the lighting unit is configured to emit light having an output value at wavelength 500 nm that is in a range from 40% to 65%, an output value at wavelength 550 nm that is in a range from 60% to 125%, an output value at wavelength 600 nm that is in a range from 80% to 145%, and an output value at wavelength 640 nm that is in a range from 85% to 155%, and the lighting unit emits light having a color temperature of 3000 to 4000 K and with the output value at wavelength 640 nm in a range of 100% to 120% relative to the output value of light at wavelength 600 nm and in a range of 110% to 160% relative to the output value of light at wavelength 550 nm.

11. The lighting device according to claim 10, wherein the light emitting element includes an LED element that emits blue light having a peak wavelength in a range from 440 to 465 nm and a half width value in a range from 20 to 40 nm.

12. The lighting device according to claim 10, wherein the fluorescent bodies includes a fluorescent body that emits green light when excited by light from the light emitting element, wherein the green light has a peak wavelength in a range from 545 to 555 nm and a half value width in a range from 110 to 150 nm, and a fluorescent body that emits red light when excited by light from the light emitting element, wherein the red light has a peak wavelength in a range from 630 to 650 nm and a half value width in a range from 80 to 110 nm.

13. A lighting device comprising a lighting unit including a light emitting element, and a plurality of fluorescent bodies, each emitting light of a different wavelength when excited by light from the light emitting element, wherein under an assumption that a peak output value of the emitted light is 100% in a range of wavelength 440 to 465 nm, the lighting unit is configured to emit light having an output value at wavelength 500 nm that is in a range from 45% to 80%, an output value at wavelength 550 nm that is in a range from 80% to 160%, an output value at wavelength 600 nm that is in a range from 115% to 220%, and an output value at wavelength 640 nm that is in a range from 130% to 250%, and the lighting unit emits light having a color temperature of 2500 to 3500 K and with the output value at wavelength 640 nm in a range of 100% to 125% relative to the output value of light at wavelength 600 nm and in a range of 135% to 185% relative to the output value of light at wavelength 550 nm.

14. The lighting device according to claim 13, wherein the light emitting element includes an LED element that emits blue light having a peak wavelength in a range from 440 to 465 nm and a half width value in a range from 20 to 40 nm.

15. The lighting device according to claim 13, wherein the fluorescent bodies includes a fluorescent body that emits green light when excited by light from the light emitting element, wherein the green light has a peak wavelength in a range from 545 to 555 nm and a half value width in a range from 110 to 150 nm, and a fluorescent body that emits red light when excited by light from the light emitting element, wherein the red light has a peak wavelength in a range from 630 to 650 nm and a half value width in a range from 80 to 110 nm.

* * * * *